United States Patent
Shih

(10) Patent No.: US 7,005,932 B2
(45) Date of Patent: Feb. 28, 2006

(54) ELECTRONIC DEVICE HAVING ADJUSTABLE VCO

(75) Inventor: Cheng-Yen Shih, Chung Li (TW)

(73) Assignee: Delta Electronics, Inc., (TW)

( * ) Notice: Subject to any disclaimer, the term of this patent is extended or adjusted under 35 U.S.C. 154(b) by 0 days.

(21) Appl. No.: 10/781,133

(22) Filed: Feb. 17, 2004

(65) Prior Publication Data

US 2004/0233007 A1    Nov. 25, 2004

(30) Foreign Application Priority Data

May 13, 2003    (TW) ................ 92112995 A

(51) Int. Cl.
*H03B 5/12*    (2006.01)

(52) U.S. Cl. .............. 331/108 C; 331/36 C; 331/107 SL; 331/177 R; 331/107 DP; 257/296; 333/235; 333/204

(58) Field of Classification Search .......... 331/107 SL, 331/177 R, 36 C, 107 DP, 108 C; 333/235, 333/204; 257/296

See application file for complete search history.

(56) References Cited

U.S. PATENT DOCUMENTS

| 5,952,901 A | * | 9/1999 | Nakano ............... 333/235 |
| 6,188,295 B1 | | 2/2001 | Tsai |
| 6,583,677 B1 | * | 6/2003 | Shintani et al. ....... 331/107 SL |

FOREIGN PATENT DOCUMENTS

TW    429670    4/2001

* cited by examiner

*Primary Examiner*—Arnold Kinkead
(74) *Attorney, Agent, or Firm*—Michael A. Glenn; Glenn Patent Group

(57) ABSTRACT

A circuit board having a VCO that can be adjusted during manufacturing is disclosed. The VCO has a resonating circuit, a coupling circuit, and an oscillating circuit. The coupling circuit and the oscillating circuit have adjustable capacitors composed of micro-strips on two conductive layers of the circuit board with an insulation layer between the two conductive layers. The micro-strips are cut in different directions by laser beams to adjust the capacity of the capacitors or to make the capacitor react as inductance so that the output frequency and the phase noise of the VCO is accurate or good enough to improve the production's yield rate.

10 Claims, 11 Drawing Sheets

ELECTRONIC DEVICE HAVING
ADJUSTABLE VCO

BACKGROUND OF THE INVENTION

1. Field of Invention

The present invention relates to a voltage control oscillator. More particularly, the present invention relates to a voltage control oscillator that is adjustable.

2. Description of Related Art

Oscillators are critical elements in circuit design nowadays, including both analog circuits and digital circuits. A voltage control oscillator (VCO) is a kind of oscillators that generates oscillating signals according to a reference voltage input to the voltage control oscillator. In other words, different reference voltage input determines different oscillating frequencies in voltage control oscillators.

Even the voltage control oscillator has been developed for a long time, new designs and challenges do not stop because quality requirements of electronic equipments become higher and higher.

Output frequency bias or phase noise of voltage control oscillators often occur due to material limitations or control difficulty of manufacturing process in mass production. Things become more difficult because such problem usually occur after assembly process of voltage control oscillators has completed. Therefore, it is a great challenge to efficiently control yield rate of voltage control oscillators.

Another common problem is that size of circuit boards are required to be more compact so that electronic devices can be made more and more smaller. It is also a great challenge to utilize every space of circuit boards to efficiently utilize every possible space.

In addition, more and more high frequency products, e.g. wireless phones or wireless networks, are developed for the market. While SMT (Surface Mounting Technology) is so popular, discontinuous effect response to high frequency in electrodes of such electronic devices using SMT to mount them on printed circuit boards often makes high frequency products instable. Therefore, it is more and more important to find a efficient method to manufacture high quality voltage control oscillators.

SUMMARY OF THE INVENTION

It is therefore an objective of the present invention to provide a voltage control oscillator that can be fine tuned and such voltage control oscillator saves space of circuit boards so that the voltage control oscillator is particularly suitable for used in high frequency communication products with compact size.

In accordance with the foregoing and other objectives of the present invention, a first embodiment according to the present invention includes a first conductive layer and a second conductive layer that are patterned, and an insulation layer is placed between the first conductive layer and the second conductive layer.

The first conductive layer is used for supporting a portion of circuit units, e.g. transistors and resistors. The voltage control oscillator includes a resonance circuit, a coupling circuit, and oscillating circuit. In addition, the first conductive layer is patterned to form a plurality of micro-strips for connecting the circuit units of the voltage control oscillator. Among these micro-strips, an upper micro-strip is formed in the coupling circuit while another overlapping lower micro-strip is formed in the second conductive layer. The upper micro-strip, the lower micro-strip and the insulation layer between them together form an adjustable micro-strip capacitor.

The upper micro-strip is cut by laser beam or other cutting tools during manufacturing process to adjust capacitance of the adjustable micro-strip. Because one end of the adjustable micro-strip capacitor is connected to the resonance circuit and another end is connected to the oscillating circuit, a coupling amount between the resonance circuit and the oscillating circuit is changed for adjusting the output frequency and phase noise. However, phase noise is the major concern in the first embodiment, output frequency of the voltage control oscillator is compensated by the second embodiment.

In the second embodiment according to the present invention, a first conductive layer and a second conductive layer are patterned in an electronic device, and an insulation layer is placed between the first conductive layer and the second conductive layer. A portion of circuit units, e.g. resistors and transistors, are supported by the first conductive layer. A voltage control oscillator includes a resonance circuit, a coupling circuit, and a oscillating circuit. In addition, the first conductive layer is patterned to produce a plurality of micro-strips for connecting the circuit units of the voltage control oscillator. Among these micro-strips, an upper micro-strip is formed in the resonance circuit while another overlapping lower micro-strip is formed in the second conductive layer. The upper micro-strip, the lower micro-strip and the insulation layer between them together form an adjustable capacitor.

During manufacturing process, the upper micro-strip is cut in different directions by laser beam or other tools so that capacitance of the adjustable capacitor is adjusted or the adjustable capacitor react as an inductor. The adjustable capacitor is placed in the resonance circuit and one end is connected to inductors of the resonance circuit and another end is grounded. When cutting the upper micro-strip in a first direction, the adjustable capacitor react as an inductor so that the resonance frequency is decreased. In the other hand, when cutting the upper micro-strip in a second direction, capacitance of the adjustable capacitor is decreased to increase the resonance frequency of the resonance circuit so that the output frequency of the voltage control oscillator can be fine tuned.

In the third embodiment according to the present invention, the first embodiment and the second embodiment are combined. That is, adjustable micro-strip capacitors are placed in both the coupling circuit and the resonance circuit so that lowest phase noise and most precise output frequency of the voltage control oscillator is obtained during manufacturing process.

Hence, there are at least following advantages of the present invention. Firstly, the voltage control oscillators according to the present invention utilize space of circuit boards efficiently. Secondly, problems caused by material or manufacturing process can be minimized because of such voltage control oscillator, particularly in high frequency applications. Thirdly, using adjustable micro-strip capacitor in the coupling circuit substitutes for traditional SMT capacitors and provides ability to fine tune phase noise. Also, discontinuous phenomenon occurred in electrodes of traditional SMT units is avoided, and therefore quality of the voltage control oscillator is upgraded. Fourthly, cutting the adjustable micro-strip capacitor in different directions provides two ways frequency fine tuning ability by changing capacitance or letting capacitor reacting as an inductor. Fifthly, the voltage control oscillator can be fine tuned and therefore yield rate is increased. Six, micro-strip capacitors bring lower cost then traditional SMT capacitors and thus increase price competition of product.

It is to be understood that both the foregoing general description and the following detailed description are by examples, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
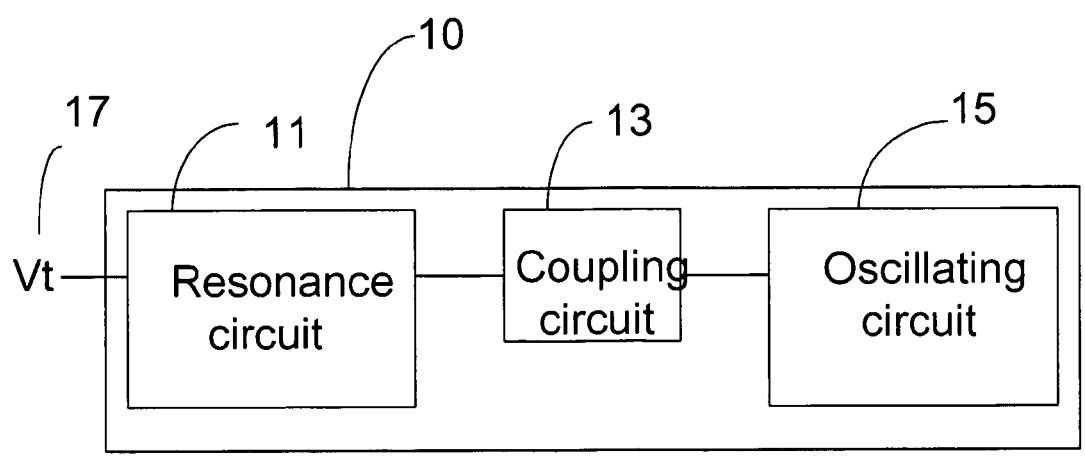
FIG. 1 is a schematic diagram of a voltage control oscillator.

Reference will now be made in detail to the present preferred embodiments of the invention, examples of which are illustrated in the accompanying drawings. Wherever possible, the same reference numbers are used in the drawings and the description to refer to the same or like parts.

Firstly, FIG. 1 illustrates a schematic diagram of a voltage control oscillator 10. An external control voltage 17 is utilized for adjusting output frequency of the voltage control oscillator 10. As shown in FIG. 1, the voltage control oscillator 10 has a resonance circuit 11, a coupling circuit 13, and a oscillating circuit 15. The oscillating circuit 15 is used for stimulating oscillation and keep oscillating signals continue. The resonance circuit 11 limit a working frequency of the voltage control oscillator 10 within a required range. The coupling circuit 13 is used for connecting the resonance circuit 11 and the oscillating circuit 15. In addition, phase noise can be adjusted by changing the coupling amount between the resonance circuit 11 and the oscillating circuit 15 by adjusting the coupling circuit 13.

Figure 2:
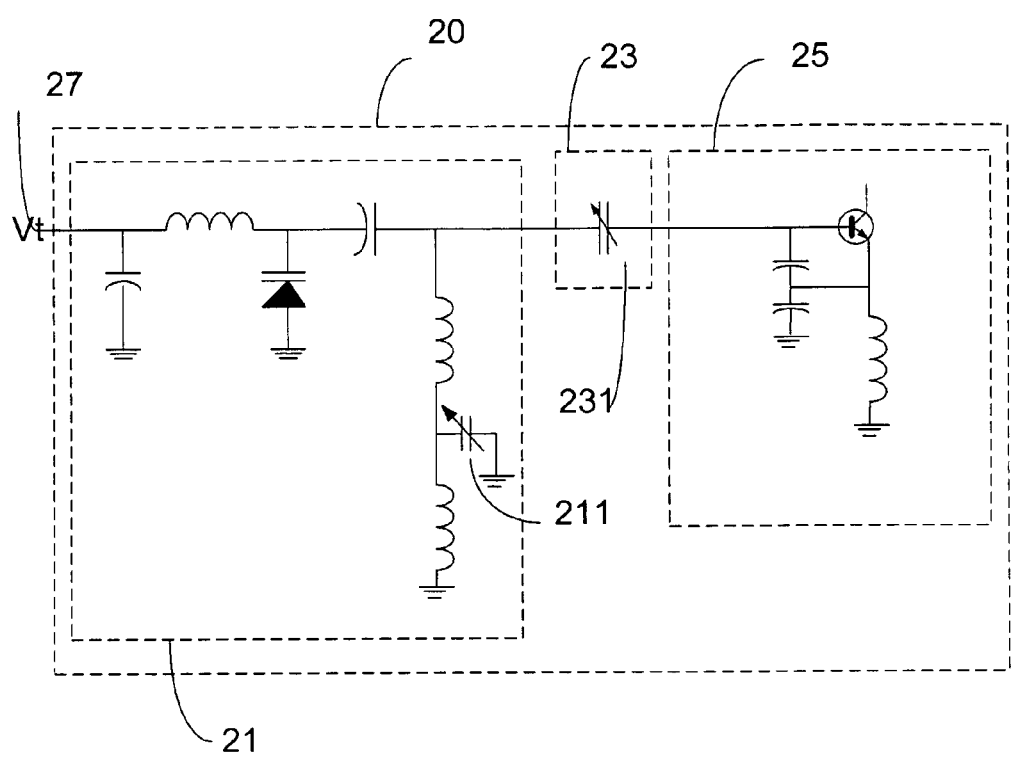
FIG. 2 is a schematic diagram of circuit units of a voltage control oscillator.

Reference is now made to FIG. 2, which illustrates a schematic diagram of a voltage control oscillator 20. The voltage control oscillator 20 has a resonance circuit 21, a coupling circuit 23, and a oscillating circuit 25.

In this example, the resonance circuit 21 is composed by a number of capacitors, inductors, an adjustable micro-strip capacitor 211, a diode with adjustable capacitance according to voltage. The coupling circuit 23 is composed of another adjustable micro-strip capacitor 231. The oscillating circuit 25 is composed of a number of capacitors, inductors, and a BJT transistor. It is to be noted that the voltage control oscillator 20 is only an example but not to limit scope of the present invention, and variations known to persons skilled in the art should still be within scope of the present invention.

Important technical features of the present invention includes design and adjustment to the adjustable capacitors 211, 231. Three embodiments are provided below for explaining related concept.

First Embodiment

In this embodiment, a voltage control oscillator installed on a printed circuit board of an electronic device is fine tuned to decrease phase noise by adjusting an adjustable micro-strip capacitor, like the adjustable capacitor 231 in FIG. 2, in a coupling circuit.

Figure 3:
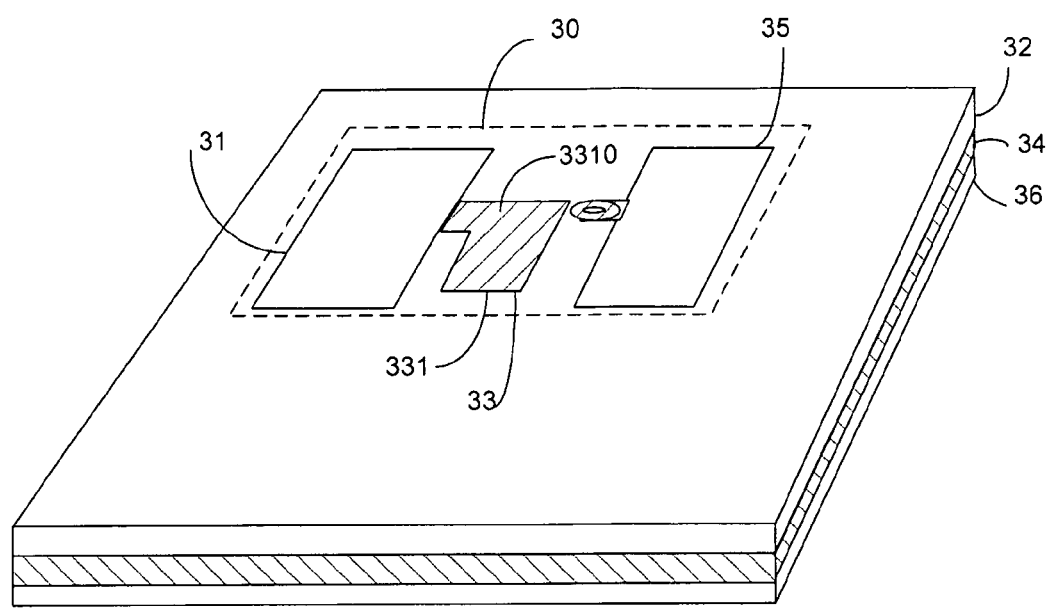
FIG. 3 is a schematic diagram of a circuit board according to the first embodiment.

FIG. 3 illustrates a circuit board structure of a voltage control oscillator 30. As shown in FIG. 3, the voltage control oscillator 30 includes a resonance circuit 31, a coupling circuit 33, and a oscillating circuit 35. Electronic diagram in FIG. 2 can be used as an example to implement the resonance circuit 31, the coupling circuit 33, and the oscillating circuit 35.

Firstly, a first conductive layer 32 is patterned to form a plurality of micro-strips. These micro-strips are conductive for connecting circuit units in the resonance circuit 31, the coupling circuit 33, and the oscillating circuit 35. Among these micro-strips, an upper micro-strip 3310 is used to be a part of a micro-strip capacitor 331 of the coupling circuit 33.

In addition, a second conductive layer 36 is patterned to form at least one lower micro-strip overlapping the upper micro-strip 3310 of the first conductive layer 32. Further, an insulation layer 34 is placed between the first conductive layer 32 and the second conductive layer 36. There is an opening in the second conductive layer 36 and conductive material is filled in the opening so that the lower micro-strip that overlaps the upper micro-strip of the first conductive layer is connected to the oscillating circuit 35 in the first conductive layer 32. With such design, the upper micro-strip 3310, the lower micro-strip and the insulation layer 34 together form an adjustable micro-strip capacitor 331.

Then, laser beam or other cutting tools are used for partially cutting the upper micro-strip 3310 to change capacitance of the adjustable capacitor 331. By changing capacitance of the adjustable capacitance 331, the electronic characteristic of the coupling circuit 33 is changed to adjust phase noise of the voltage control oscillator 30 to obtain output with lowest phase noise.

Figure 4:
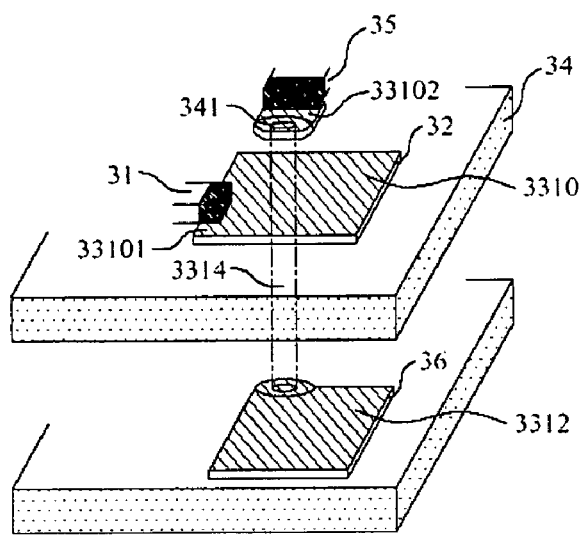
FIG. 4(a) is an explosion view of an adjustable capacitor according to the first embodiment.
FIG. 4(b) is an electronic diagram corresponding to FIG. 4(a)
Figure 4:
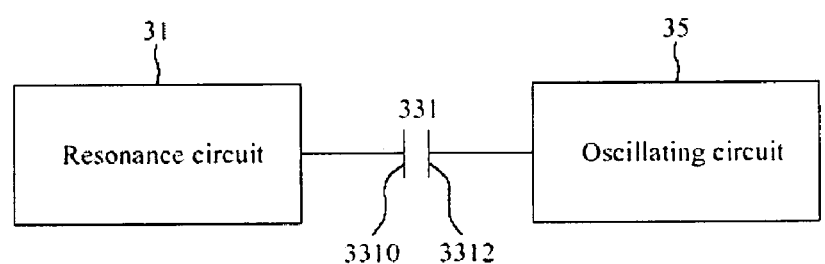

To more clearly explain the structure of the adjustable capacitor 331, reference is now made to FIG. 4(a), which is a assembling diagram of the voltage control oscillator 30 in FIG. 3.

As mentioned above, the adjustable micro-strip capacitor 331 is used a circuit unit of the coupling circuit 33 of the voltage control oscillator 30. One end 33101 of the adjustable capacitor 331 is connected to the resonance circuit 31, and the other end 33102 of the adjustable capacitor 331 is connected to the oscillating circuit 35. The adjustable capacitor 331 is composed of the upper micro-strip 3310, the lower micro-strip 3312, and the insulation layer 34. The insulation layer 34 has an opening 341 filled with conductive material 3314 for connecting the lower micro-strip to the oscillating circuit 35. In short, the electronic structure in FIG. 4(a) leads to the voltage control oscillator 30 in the schematic diagram of FIG. 4(b).

Figure 5A:
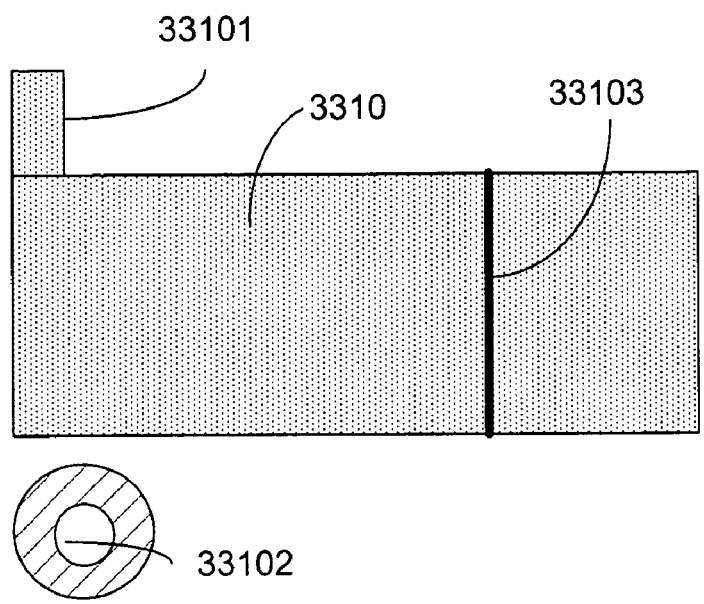
FIG. 5(a) illustrates adjusting the adjustable capacitor of the first embodiment.
Figure 5B:
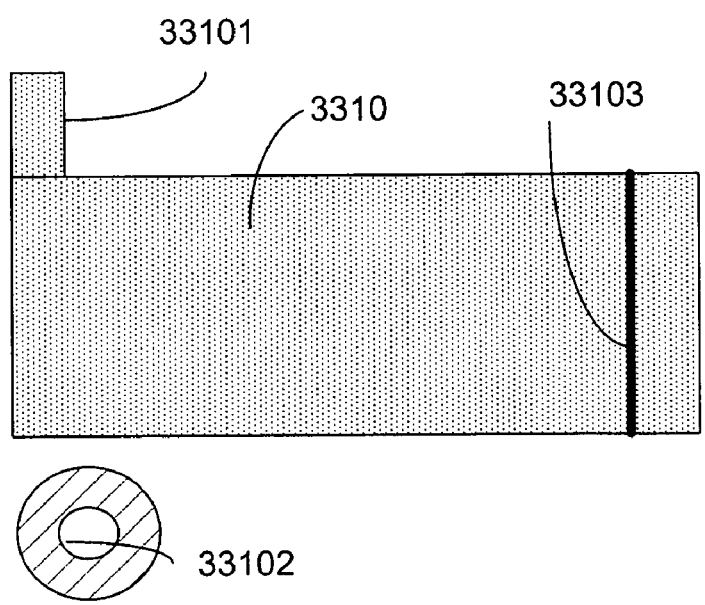
FIG. 5(b) illustrates adjusting the adjustable capacitor of the first embodiment.

Reference is now made to FIG. 5(a) and FIG. 5(b), which illustrate two overviews of the upper micro-strip 3310 in two adjustment statuses. During manufacturing voltage control oscillator 30, laser beam or other cutting tools are used to cut the upper micro-strip 3310. Examples of cutting traces are illustrated in FIG. 5(a) and FIG. 5(b). By cutting different locations in the upper micro-strip 3310, the adjustable micro-strip capacitor 331 has different capacitance. For example, the cutting trace shown in FIG. 5(a) brings a smaller capacitance to the adjustable capacitor 331 then the cutting trace shown in FIG. 5(b).

Because the adjustable micro-strip capacitor 331 is used as a circuit unit in the coupling circuit 33 of the voltage control oscillator 30, coupling amount between the resonance circuit 31 and the oscillating circuit 33 is adjustable by changing capacitance of the adjustable capacitor 331. According to different cutting traces on the micro-strip, different phase noises and output frequencies are generated. However, seeking the best coupling amount is the critical concern of this embodiment by adjusting the coupling capacitor for obtaining output with lowest phase noise. If the frequency of output signal is out of a predetermined range, the following second embodiment is used to compensate frequency bias.

Second Embodiment

In this embodiment, a voltage control oscillator installed on a printed circuit board of a electronic device is adjusted by tuning an adjustable micro-strip capacitor of a resonance circuit connected in parallel. For example, the adjustable micro-strip capacitor 211 is adjusted for tuning a output frequency of the voltage control oscillator during manufacturing the voltage control oscillator.

Figure 6A:
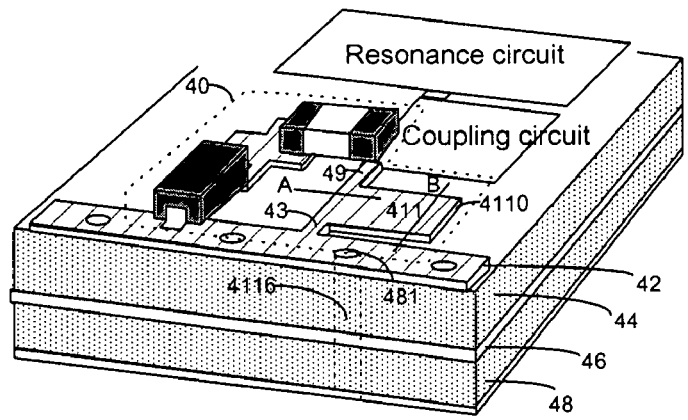
FIG. 6(a) illustrates a sectional view of an adjustable capacitor of the second embodiment.

Reference is now made to FIG. 6(a), which illustrates a schematic diagram of a circuit board structure of a voltage control oscillator 40. The voltage control oscillator 40 includes a resonance circuit, a coupling circuit, and a oscillating circuit. The electronic diagram in FIG. (2) can be used as an example for implementing the resonance circuit, the coupling circuit, and the oscillating circuit.

Electronic structure of this embodiment is explained as follows. Firstly, a first conductive layer 42 is patterned to form a plurality of micro-strips. These micro-strips are conductive for connecting the resonance circuit, the coupling circuit, and the oscillating circuit. Among these micro-strips, a upper micro-strip 4410 is part of the resonance circuit.

A second conductive layer 46 is also patterned so that there is at least one lower micro-strip grounded and the lower micro-strip overlaps the upper micro-strip 4110 of the first conductive layer 42. In addition, an insulation layer 44 is placed between the first conductive layer 42 and the second conductive layer 46. There is an opening 481 in the insulation layer 44 and conductive material 4116 is filled in the opening 481 for connecting the lower micro-strip of the second conductive layer 46 that overlaps the upper microstrip 4110 of the first conductive layer 42 to the oscillating circuit on the first conductive layer 42. With such design, the upper micro-strip 4110, the lower micro-strip and the insulation layer 44 together form an adjustable capacitor 411, and this adjustable capacitor 411 is placed in the resonance circuit.

Then, an output frequency of the voltage control oscillator is determined whether to be increased or to be decreased. When determined to decrease the output frequency, laser beam or other cutting tools are used to cut the upper micro-strip in a first direction A. With such cutting trace, the adjustable capacitor react as an inductor so that the resonance frequency of the resonance circuit is decreased. In other hand, when determined to increase the output frequency, laser beam or other cutting tools are used to cut the upper micro-strip in a second direction B to decrease capacitance of the micro-strip 411 to increase the resonance frequency of the resonance circuit. By using such manner of this embodiment, the output frequency of the voltage control oscillator 40 can be fine tuned during manufacturing the voltage control oscillator 40.

Figure 6B:
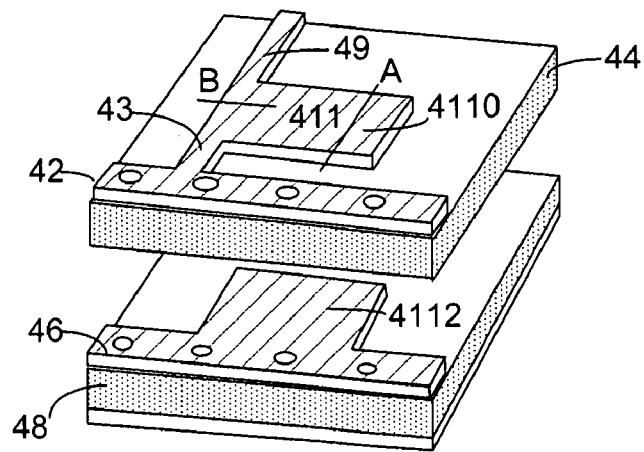
FIG. 6(b) is an explosion view of the adjustable capacitor in FIG. 6(a)

To more clearly explain the structure of such kind of adjustable micro-strip capacitor, FIG. 6(b) is used for illustrating the structure of the adjustable capacitor 411. Because the adjustable capacitor 411 is similar to the adjustable capacitor 331 partially, elements with similar or same numerals are reference to the descriptions above in the following explanation.

Figure 6C:
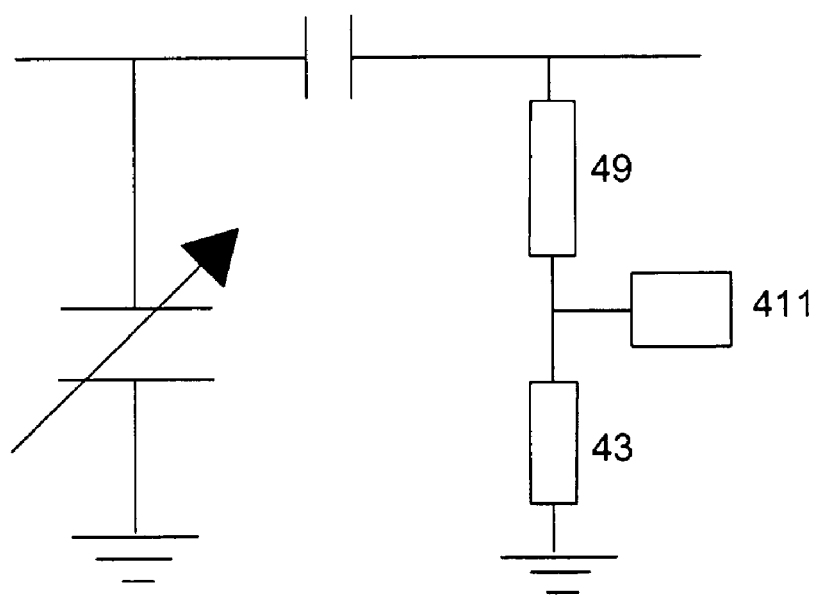
FIG. 6(c) is an schematic diagram of FIG. 6(a)

The adjustable capacitor 411 is composed of an upper micro-strip 4110, a lower micro-strip 4112, and the insulation layer 44. The upper micro-strip 4110 and the lower micro-strip 4112 are generated by patterning a first conductive layer 42 and a second conductive layer 46 respectively. In this example, one end of the upper micro-strip 4110 of the adjustable capacitor 411 is connected to an inductors 49 and 43. Another end of the upper micro-strip 4110 is connected to ground via conductive material 4116 filled in an opening 481 of the insulation layer 48. In addition, FIG. 6(c) illustrates a electronic diagram showing the adjustable capacitor 411 connecting to the inductor 49 and 43 in parallel.

Figure 7A:
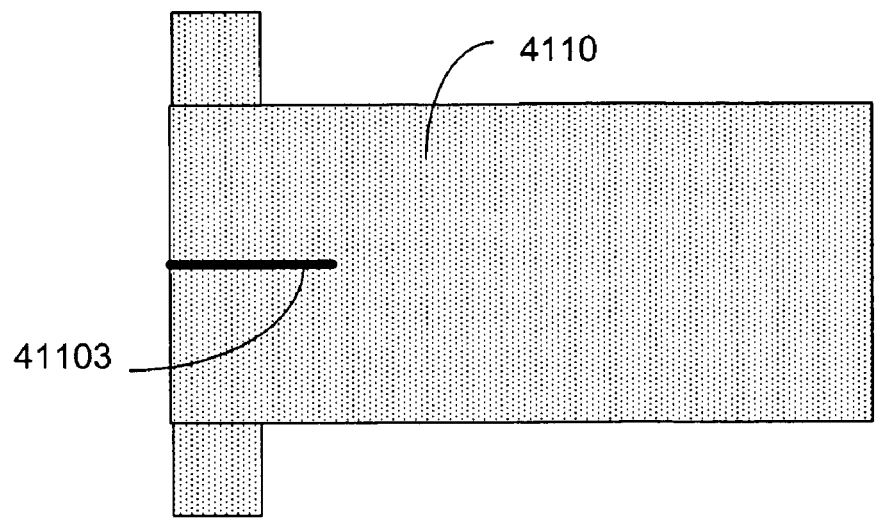
FIG. 7(a) illustrates adjusting the adjustable capacitor of the second embodiment in a first direction.
Figure 7B:
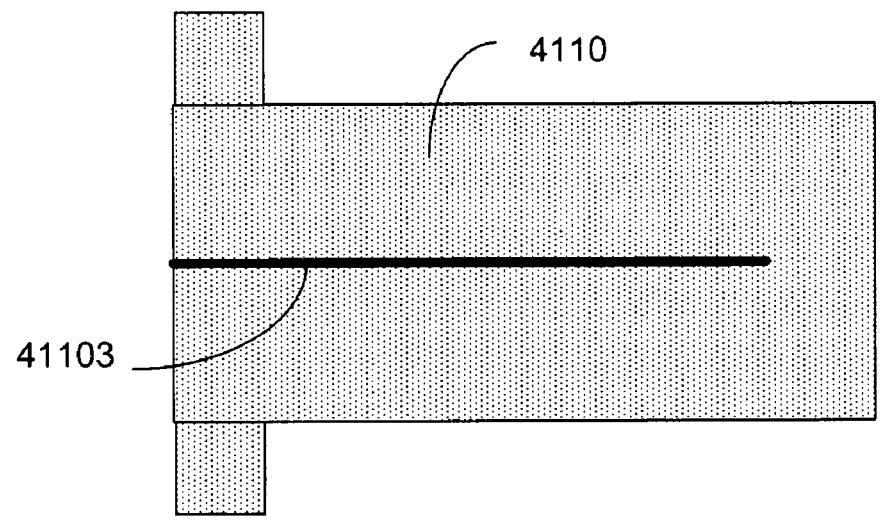
FIG. 7(b) illustrates adjusting the adjustable capacitor of the second embodiment in a first direction.

Next, reference is now made to FIGS. 7(a) and 7(b), which illustrates cutting the upper micro-strip of the adjustable capacitor 411 in a first direction A so that the adjustable capacitor 411 react as an inductor. With such cutting trace, the resonance frequency of the resonance circuit is changed and consequently output frequency range of the voltage control oscillator is changed in response.

For example, the cutting trace 41103 in FIG. 7(a) on the upper micro-strip 4110 using laser beam or other cutting tools decrease output frequency of the voltage control oscillator. A even lower output frequency can be obtained by cutting the upper micro-strip with the cutting trace illustrated in FIG. 7(b).

Figure 7C:
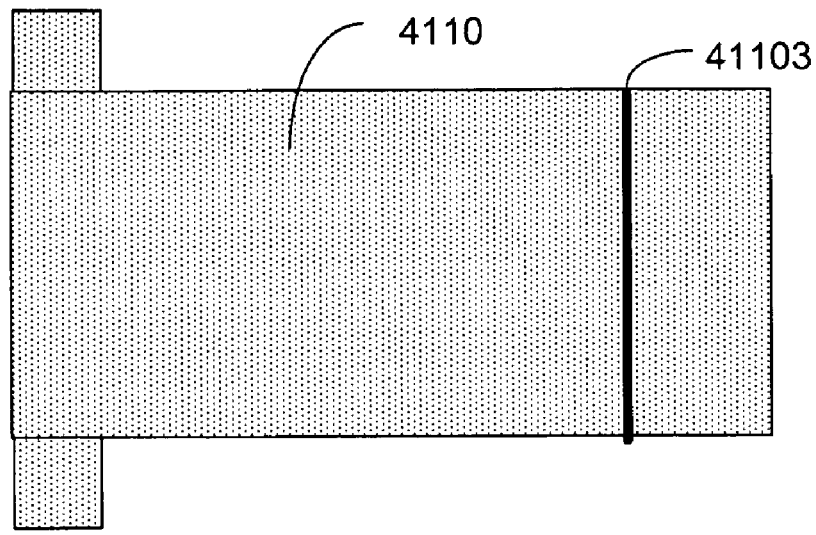
FIG. 7(c) illustrates adjusting the adjustable capacitor of the second embodiment in a second direction.
Figure 7D:
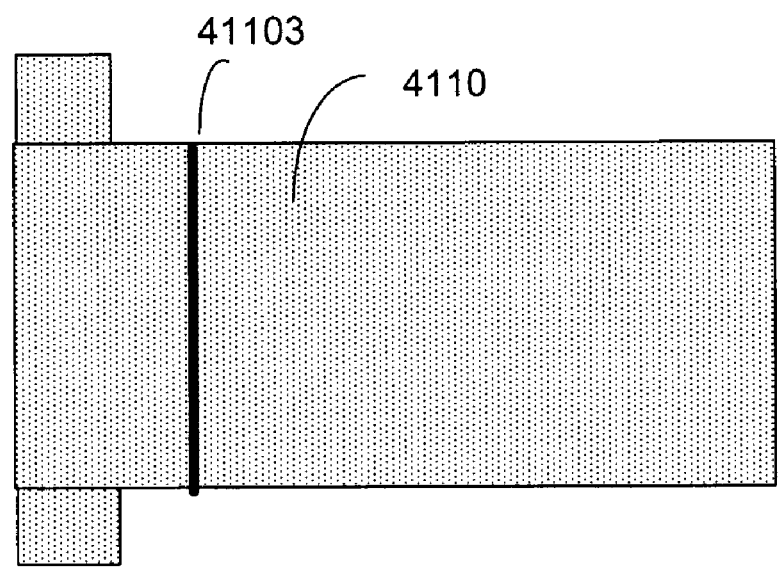
FIG. 7(d) illustrates adjusting the adjustable capacitor of the second embodiment in a second direction.

Then, FIG. 7(c) and FIG. 7(d) illustrate cutting the upper micro-strip 4110 of the adjustable capacitor 411 in a second direction B to increase the resonance frequency when the capacitance connected in parallel is decreased by decreasing capacitance of the adjustable capacitor 411. The cutting trace 41109 in FIG. 7(d) using laser beam or other cutting tools to cut the upper micro-strip brings an even higher output frequency of the voltage control oscillator.

Second Embodiment

In addition to the two embodiments above which setting adjustable capacitors on the coupling circuit and the resonance circuit respectively another embodiment is to place adjustable capacitors on both the coupling circuit the resonance circuit.

Figure 8A:
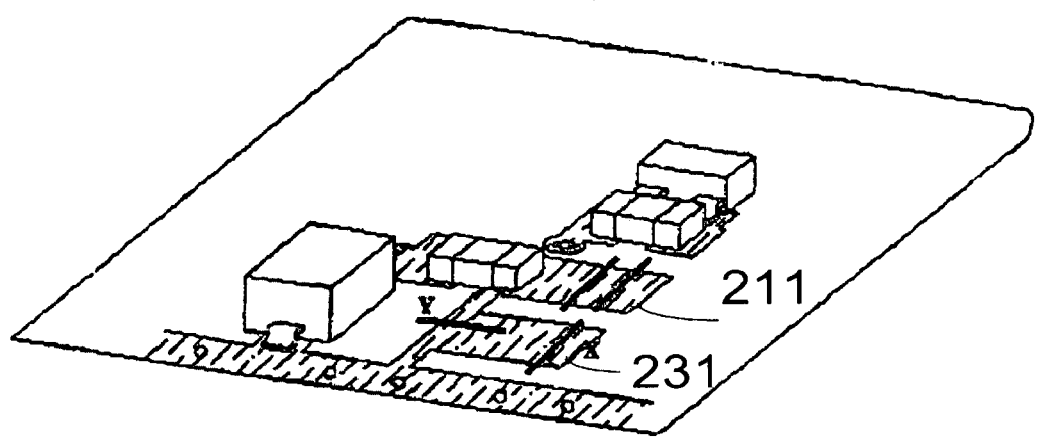
FIG. 8(a) illustrates the third embodiment according to the present invention.

That is, the third embodiment combines the first embodiment and the second embodiment. Reference is now made to FIG. 8(a), which illustrates a circuit board that combines the first embodiment and the second embodiment. In this circuit board, adjustable capacitors 211 and 231 that have micro-strips are placed in the coupling circuit and the resonance circuit of the voltage control oscillator. The adjustable micro-strip capacitor 211 can be cut in different locations for providing different coupling amount to obtain lowest phase noise. The adjustable capacitor 231 can be cut in the X direction and/or Y direction to precisely fine tuning the output frequency of the voltage control oscillator.

Figure 8B:
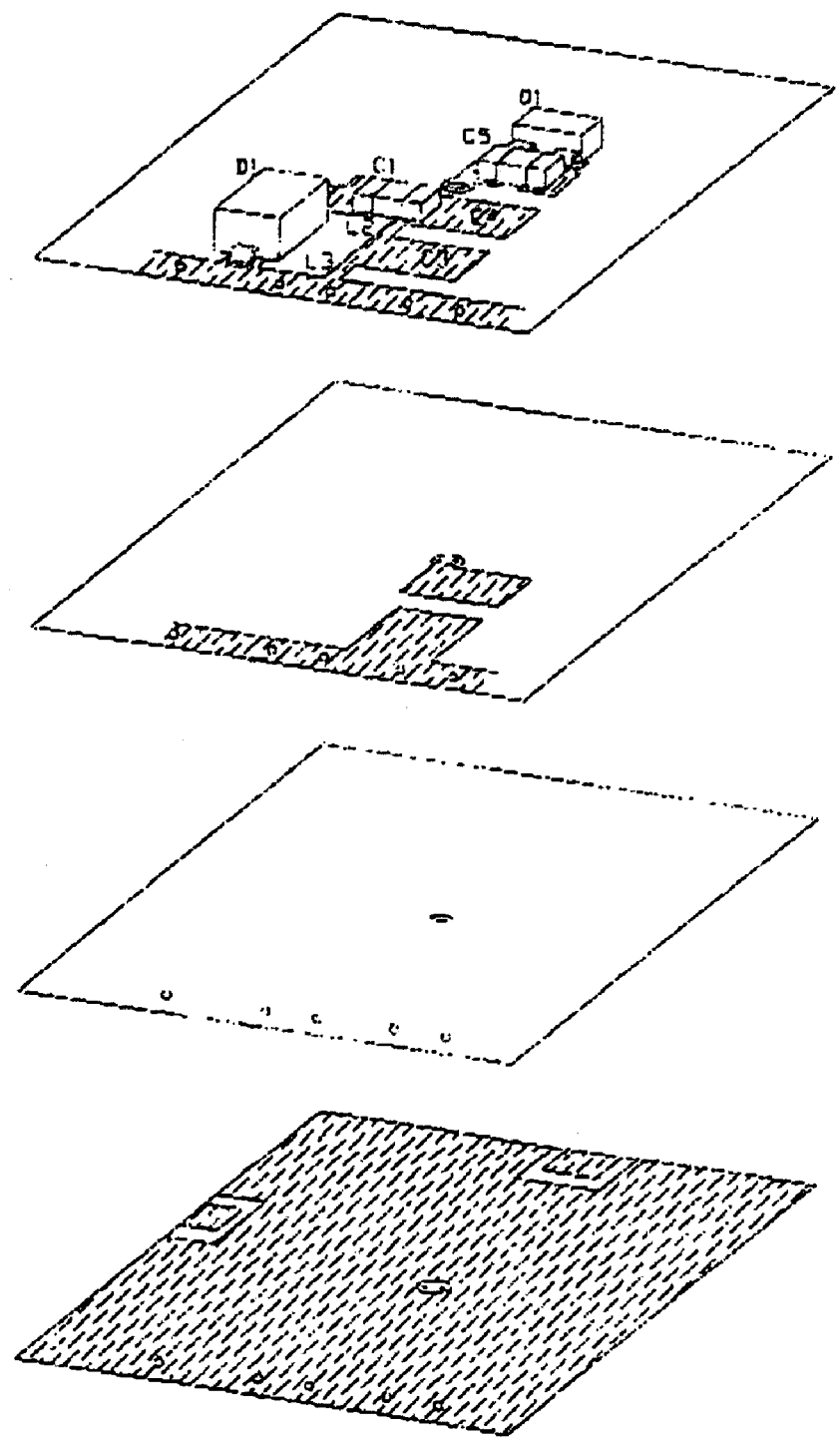
FIG. 8(b) illustrates elements in each layer of the third embodiment.

Besides, FIG. 8(b) illustrates an explosion figure of FIG. 8(a) for more clearly explaining the concept of the present invention.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A phase noise fine tuning electronic device comprising:
   a plurality of circuit units of a voltage control oscillator, wherein the voltage control oscillator includes a resonance circuit, a coupling circuit, and an oscillating circuit;
   a first conductive layer for placing the plurality of circuit units, wherein a plurality of micro-strips of the conductive layer are patterned for connecting the plurality of circuit units;
   a second conductive layer; and
   a first insulation layer placed between the first conductive layer and the second conductive layer, the first insulation layer having a first opening filled with conductive material,
   wherein a first lower micro-strip patterned in the second conductive layer, a first upper micro-strip patterned in the first conductive layer and the insulation layer together form an adjustable capacitor of the coupling circuit, whereby phase noise of the voltage control oscillator is diminished by cutting the first upper micro-strip to change capacitance of the adjustable capacitor.

2. The electronic device of claim 1, wherein one end of the adjustable capacitor is connected to the resonance circuit and the other end of the adjustable capacitor is connected to the oscillating circuit.

3. The electronic device of claim 2, wherein a second upper micro-strip is patterned in the first conductive layer, and a second lower micro-strip overlapping the second upper micro-strip is patterned in the second conductive layer such that the second upper micro-strip, the second lower micro-strip, and the insulation layer together form a second adjustable capacitor connecting to an inductor of the resonance circuit so that an electronic characteristic of the resonance circuit is adjusted by partially cutting the second upper micro-strip, and wherein the second adjustable capacitor decreases a resonance frequency of the resonance circuit when the second upper micro-strip is cut in a first direction, and capacitance of the second adjustable capacitor is decreased to increase the resonance frequency of the resonance circuit when the second upper micro-strip is cut in a second direction, whereby an oscillating frequency range of the voltage control oscillator is fine tuned.

4. The electronic device of claim 3, wherein two ends of the second adjustable capacitor are respectively connected to the inductor and ground.

5. The electronic device of claim 4, further comprising a third conductive layer and a second insulation layer, wherein the second insulation layer is placed between the second conductive layer and the third conductive layer, the second insulation layer has an second opening filled with conductive material and the third conductive layer is connected to ground for grounding the plurality of circuit units in the first conductive layer and the second conductive layer.

6. A phase noise fine tuning electronic device comprising:
   a plurality of circuit units of a voltage control oscillator, wherein the voltage control oscillator includes a resonance circuit, a coupling circuit, and an oscillating circuit;
   a first conductive layer for placing the plurality of circuit units, wherein a plurality of micro-strips are patterned in the first conductive layer for connecting the plurality of circuit units;
   a second conductive layer; and
   a first insulation layer placed between the first conductive layer and the second conductive layer, wherein a first upper micro-strip patterned in the first conductive layer, a first lower micro-strip patterned in the second conductive layer, and the first insulation layer together form a first adjustable capacitor connected to an inductor of the resonance circuit, and wherein the first upper micro-strip is cut in a first direction to decrease a resonance frequency of the resonance circuit, and capacitance of the first adjustable capacitor is decreased when the first upper micro-strip is cut in a second direction to increase the resonance frequency of the resonance circuit whereby oscillating frequency range of the voltage control oscillator is fine tuned.

7. The electronic device of claim 6, wherein two ends of the first adjustable capacitor are respectively connected to the inductor and ground.

8. The electronic device of claim 7, further comprising a third conductive layer and a second insulation layer, wherein the second insulation layer is placed between the third conductive layer and the second conductive layer, the second conductive layer has a second opening filled with conductive material, and the third conductive layer is connected to ground for grounding the plurality of circuit units in the first conductive layer and the second conductive layer.

9. The electronic device of claim 8, wherein a second upper micro-strip is patterned in the first conductive layer to be used in the coupling circuit, and a second lower micro-strip overlapping the second upper micro-strip is patterned in the second conductive layer so that the second upper micro-strip, the second lower micro-strip, and the first insulation layer together form a second adjustable capacitor, whereby phase noise of the voltage control oscillator is decreased when fine tuning the voltage control oscillator by partially cutting the second upper micro-strip to adjust capacitance of the second adjustable capacitor of the coupling circuit.

10. The electronic device of claim 9, wherein two ends of the second adjustable capacitor are connected to the resonance circuit and the oscillating circuit respectively.

* * * * *